United States Patent
Hofrichter et al.

(10) Patent No.: US 8,282,997 B2
(45) Date of Patent: Oct. 9, 2012

(54) METHOD FOR PRODUCING A HYDROPHOBIC COATING, DEVICE FOR IMPLEMENTING SAID METHOD AND SUPPORT PROVIDED WITH A HYDROPHOBIC COATING

(75) Inventors: Alfred Hofrichter, Aachen (DE); Herve Montigaud, Neuilly sur Marne (FR); Jean-Christophe Giron, Aachen (DE)

(73) Assignee: Saint Gobain Glass France, Courbevoie (FR)

( * ) Notice: Subject to any disclaimer, the term of this patent is extended or adjusted under 35 U.S.C. 154(b) by 1014 days.

(21) Appl. No.: 11/597,658

(22) PCT Filed: May 26, 2005

(86) PCT No.: PCT/FR2005/050368
§ 371 (c)(1),
(2), (4) Date: Sep. 24, 2008

(87) PCT Pub. No.: WO2005/118501
PCT Pub. Date: Dec. 15, 2005

(65) Prior Publication Data
US 2009/0297863 A1    Dec. 3, 2009

(30) Foreign Application Priority Data
May 26, 2004    (DE) .................. 10 2004 026 344

(51) Int. Cl.
*C23C 14/02*    (2006.01)
*H05H 1/00*    (2006.01)
*C04B 41/00*    (2006.01)
(52) U.S. Cl. ......... 427/534; 427/533; 427/535; 427/532
(58) Field of Classification Search .................. 427/164, 427/165, 532, 533, 534, 535; 216/67, 69, 216/71
See application file for complete search history.

(56) References Cited

U.S. PATENT DOCUMENTS
4,331,702 A * 5/1982 Hieber et al. ............... 427/10
(Continued)

FOREIGN PATENT DOCUMENTS
EP    0 475 510    3/1992
(Continued)

OTHER PUBLICATIONS
Nakajima et al, Processing of roughened silica film by coagulated colloidal silica for super-hydrophobic coating, 2001, Journal of Materials Science Letters, vol. 20, p. 1975-1977.*

*Primary Examiner* — Dah-Wei Yuan
*Assistant Examiner* — Nga Leung Vera Law
(74) *Attorney, Agent, or Firm* — Oblon, Spivak, McClelland, Maier & Neustadt, L.L.P.

(57) ABSTRACT

The invention concerns a method for producing a coating on a support, in particular a glass support, wherein a thin-film metal oxide is deposited on the support, said thin film being subjected to an etching process to roughen its surface, a second coating capable of adhering to the first metal oxide film is then applied on the roughened surface. The invention is characterized in that it consists in depositing a first doped metal oxide or metal oxynitride doped with at least a second metal oxide or metal oxynitride, the second metal oxide or metal oxynitride being distributed in the deposited film. During the etching process, a plasma-activated gas is used which removes at least a second metal oxide or metal oxynitride less than the first metal oxide or metal oxynitride so as to form, after the etching process, on the surface raised irregularities consisting of at least a second metal oxide or metal oxynitride.

15 Claims, 2 Drawing Sheets

U.S. PATENT DOCUMENTS

| | | | |
|---|---|---|---|
| 5,800,918 A * | 9/1998 | Chartier et al. | 428/336 |
| 5,985,378 A | 11/1999 | Paquet | |
| 2002/0051870 A1 * | 5/2002 | Honjo et al. | 428/210 |
| 2002/0168468 A1 | 11/2002 | Chou et al. | |
| 2002/0182453 A1 * | 12/2002 | McCurdy et al. | 428/702 |

FOREIGN PATENT DOCUMENTS

| | | |
|---|---|---|
| EP | 0 476 510 | 3/1992 |
| EP | 476510 A1 * | 3/1992 |
| EP | 0 839 928 | 5/1998 |
| JP | 4-124047 | 4/1992 |
| JP | 4-275950 | 10/1992 |
| JP | 5-24886 | 2/1993 |
| JP | 05024887 A * | 2/1993 |
| JP | 06 116430 | 4/1994 |
| JP | 6-262943 | 9/1994 |
| JP | 9-115917 | 5/1997 |
| JP | 10-140358 | 5/1998 |
| WO | 2005/084943 | 9/2005 |

* cited by examiner

METHOD FOR PRODUCING A HYDROPHOBIC COATING, DEVICE FOR IMPLEMENTING SAID METHOD AND SUPPORT PROVIDED WITH A HYDROPHOBIC COATING

CROSS-REFERENCE TO RELATED APPLICATIONS

This application is a 371 of PCT/FR05/050368 filed May 26, 2005 and claims the benefit of DE 10 2004 026 344.2 filed May 26, 2004.

The invention relates to a method for producing a hydrophobic coating that has the features of the preamble of claim 1, to a device for implementing the method and to supports provided with a hydrophobic coating.

Intensive research has been carried out for a long time on coatings that have hydrophobic properties, in particular for window panes, and that thus, on the one hand, improve vision through these window panes in the event of moisture condensation and, on the other hand, are to simplify the cleaning of the window panes.

As a measure of the wettability of a surface or of surfaces forming boundaries with another phase, the contact angle is frequently used. This is the angle that a tangent to the outline of the drop makes at the point of intersection of the three phases at the surface of the solid body. The wetting is worse the higher the contact angle.

A hydrophobic coating on the surface of windows reduces the adhesion of water drops on the coated surface by bringing, if possible, said contact angle to a value greater than 90°.

A basic problem with these coatings is their relatively poor resistance to mechanical stresses (abrasion by dust or fouling particles that are deposited thereon, or by wiping). This reduces, for example for a long time, the long-term reliability of the hydrophobic coatings on vehicle windshields, which are stressed not only by the particles that strike them when the vehicles are moving but also by the windshield wipers (and in the latter case in particular when the windshield wipers operate dry).

Document EP 0 866 037 B1 discloses a method of forming a water-repellent multilayer coating that has a metal oxide first layer and a water-repellent second layer on a glass support, in which the metal oxide layer is formed with a slightly rough surface, the second layer being applied to this rough surface and then being heated in a range between 100 and 300° C. The second layer is produced by a sol-gel process from a mixture of fluoroalkylsilanes, antimony-oxide-doped tin oxide particles, a silicon compound, water and an organic solvent.

The present specification relates to the same theme as many patent publications that have already disclosed successions of metal oxide layers (for example $SiO_2$ layers) and of fluorine-based hydrophobic compounds (for example perfluoroalkylsilanes).

Thus, document JP-A 4 124 047 also discloses a method in which a first metal oxide layer undergoes an etching operation after having been deposited on a support, in order to roughen its surface slightly, a hydrophobic layer then being applied to this roughened surface.

Document JP-A 6 116 430 describes a method in which an $SiO_2$ layer deposited on a support undergoes a plasma etching operation in order to make its surface slightly rough, a monomolecular chemical absorption layer containing fluorine then being applied to this roughened surface.

Document EP 0 476 510 A1 discloses a similar method by which a metal oxide layer applied on a glass surface by a sol-gel process is treated with an acid or a plasma in order to roughen it, after which a fluorine or silicone layer is applied to this surface.

According to the abovementioned EP-B1 patent, these methods are considered to be complicated, and other approaches are sought in order to achieve greater resistance of a hydrophobic coating to mechanical stresses, the "windshield wiper" stress being explicitly claimed and being evaluated in the testing of the coating.

Document EP 0 545 201 B1 also describes another relevant method in which a sol-gel layer consisting of a silicon oxide mixed with other mineral oxides is applied to a glass support as a primer or as adhesion promoter. Although no special surface treatment of the type mentioned several times above is carried out, the primer may be applied to glass surfaces even before a bending and/or prestressing heat treatment, and is therefore sufficiently resistant to high temperatures.

The problem at the basis of the invention is to propose another method of producing a hydrophobic coating in which a multilayer system is created that is resistant to all stresses exerted on that surface of the support which is exposed in the fitted state.

According to the invention, this problem is solved with the features of claim 1. The features of the dependent claims give advantageous developments of the present invention.

The invention also relates to a device for implementing a method according to the invention and to products that can be manufactured with this device.

It has been found that a plasma etching operation or an etching operation using a plasma-activated gas may have different effects on various materials that a multilayer system contains. It is therefore possible to carry out selective etching.

The invention draws advantage therefrom by producing the layer applied on the support from at least two different metal oxides or metal oxynitrides. When, hereafter, the text simply refers only to metal oxides, this does not however exclude the use of equivalent oxynitrides.

The plasma, the plasma-activated gas and the appropriate treatment installation are controlled and operated in such a way that one of these metal oxides is deposited much less than another (matrix material). This result may be expected in particular by not simultaneously bringing all the materials of the layer into the gas phase under the same plasma or etching conditions.

In this way, the surface of the layer is formed with a roughness whose irregularity obviously depends on the distribution of the second metal oxide or doping metal oxide in the material of the matrix. This irregular surface of the layer must be considered functionally as primer or adhesion promoter for the hydrophobic coating that will be applied later. In addition, hydrophobic coating particles will preferably accumulate in the "valleys" of the irregular surface and thus will no longer be able to be removed without problem, even by a mechanical action. Owing to the roughness of the surface, the treated layer also has a low modified reflection coefficient.

According to the invention, the doped metal oxide coating may preferably be deposited by magnetically enhanced vacuum sputtering (hereinafter called "sputtering"). Other deposition techniques, for example CVD, plasma-enhanced CVD and evaporation, are however also, and obviously, envisaged.

As matrix material, $SiO_2$ is mainly envisaged because, on the one hand, it adheres very well to glass surfaces and, on the other hand, it has a high proportion of free OH bonds which themselves ensure good adhesion of the hydrophobic coating that will be applied later. This will be discussed further later on.

Silicon may also be deposited at high deposition rates in sputtering installations. A $SiO_2$ target having an 8% aluminum content has proved to be very suitable in trials. However, other doping elements, for example carbon, titanium, zirconium, zinc and boron, Rb, Cs, K, Na, Li, Ba, Sr, Mg and alkali and alkaline-earth metals and rare earths, have also been envisaged and it is absolutely possible also to use layers consisting of mixed oxides or ternary mixed oxynitrides, provided that they meet the requirements in terms of light transmission.

Basically, in addition to $SiO_x$ (where $x \leq 2$), it is also possible to use other matrix materials, for example SiOC, SiON and SiOCN, to which hydrogen may optionally also be combined (general formula $SiO_xC_yH_zN_u$).

The entire composition of the lower coating, which will be deposited on the support directly or possibly after a barrier layer, and therefore in particular the second metal oxide (or oxynitride), is selected primarily according to the particular condition that the glass pane thus coated must still be bent and possibly prestressed before application of the hydrophobic coating. The deposited coating must therefore be able to withstand, without being damaged, temperatures above 650° C. Here the expression "without being damaged" also means, independently of the retention of adhesion and the absence of cracks (quality of the layer), that a sufficient (total) transmission of visible light in the greater than 70% range, and in the case of windshield glass even at least 75%, be retained (or obtained, at least after the heat treatment). This means that an individual layer must have an even higher transmittance than the values mentioned.

It is conceivable to incorporate, again in the method, an activation step after the plasma etching (or to carry out the activation at the same time as the etching) in order to obtain, in a known manner, even greater chemical adhesion of the hydrophobic layer to the metal oxide layer.

Right from application of the first layer, the operational parameters are adjusted in such a way that the layer receives a relatively rough surface. This may for example be achieved by a relatively high sputtering pressure and/or by using lower sputtering energies.

As is known, the metal oxides may be deposited in a reactive working gas atmosphere (which contains oxygen) using metal targets or in an inert atmosphere (argon) using oxide targets. Optionally, the targets may contain right from the start the mixture of desired materials (alloys). This makes it possible to dispense with the use in parallel of several targets consisting of the various constituent materials of the layer.

On glass supports, the final composition of the layer before the etching operation may also be influenced by intermediate steps, for example heat treatments such as bending and prestressing treatments. In particular because of diffusion processes, this may result in enrichment of the layer with atoms, particularly alkali metal atoms, coming from the glass.

If these diffusional transitions are undesirable, a barrier layer may be provided between the support and the metal oxide or oxynitride base layer. These barrier layers, which prevent the diffusion of alkali elements or other elements coming from the glass, are known per se, so that it is unnecessary for them to be discussed further here.

The treated glass pane may be assembled or converted in order to obtain ready-to-use products (windshield glass, glass wall cladding, shower cabinets, refrigerator doors, etc.).

The plasma etching operation or the etching operation using a plasma-activated gas may be carried out in various installations. What is important is the presence of a reactant that acts selectively only on the material of the doped metal oxide layer, this reactant being fluorine in the preferred example. The plasma operation may be conducted so as to selectively etch the doped and treated metal oxide layer. In the example of an aluminum-doped silicon oxide layer, this $SiF_4$ (volatile) gas phase forms in the plasma, which phase allows silicon to be extracted, whereas aluminum fluoride compounds are not gaseous at the same time and thus remain on the support or in the layer.

For example, an RF capacitive parallel-plate reactor may be used.

Another system that may be used comprises a vacuum chamber in which the support to be etched is placed. This chamber is penetrated by one or more tubes made of nonconducting material (ceramic, $Al_2O_3$, quartz) in which an electrical conductor, connected to the two sides of a respective microwave (magnetron) generator, is placed.

Inside of the tube is an atmospheric pressure. Consequently, the formation of a plasma inside the tube is impeded, but the electric field of the conductor passes through the wall of the tube and a homogeneous plasma may be ignited on the periphery of the tube. By adjusting the power supplied to the two sides, it is also possible to vary the plasma locally so as to form a more dense plasma at the ends of the tube.

Said tubes may even reach up to four meters in length, so that these installations make it possible to prestress float glass of the standard 3.2 width, and then to etch them with a view to their coating.

Finally, the treatment may be carried out in a closed chamber, for example in a large steel chamber, the activation of the plasma taking place outside this chamber and the plasma-activated etching gas being supplied by a device for distributing it over the coated support. Such a device will be described at greater length later on as an exemplary embodiment.

As etching gas, the etching gases known in the industry and in the art are envisaged, for example $SF_6$, $CF_4$, $C_2F_6$ and $CHF_3$, or in general $C_xF_yH_z$, most of the time as a mixture with $O_2$. A gas whose plasma-activated state is maintained for as long as possible, and therefore a gas whose radicals have a particularly long lifetime, is selected.

The supply of working or etching gas, via the site, the quantity, the pressure, the activation energy, etc., provides other options for varying the result of the etching operation.

It has turned out that, before the plasma operation, the distribution of Al over the thickness of the layer is relatively uniform, whereas after the plasma operation it has a pronounced peak in the approximately 20 nm range. This may be explained by the fact that, after the tearing of the $SiO_2$ matrix in the outer region of the layer, Al is densified on the surface with higher concentrations, thus providing said peaks. At the same time, the presence of silicon in the upper boundary region of the layer in contact with air sharply decreases.

This may also prove to be so for doping elements other than aluminum.

It is also possible to detect, in the doped metal oxide coating applied or deposited on the glass, other alkali metal atoms after the heat treatment of the glass support. At high temperatures, these atoms diffuse out of the glass (usually a silicate glass) in order to penetrate into the coating. It has also been observed that the position of the alkali metal atoms over the thickness of the layer is modified during the plasma treatment or because of said treatment, so that traces of the treatment on the product may be detected.

The hydrophobic layer or coating are preferably represented by the general formula:

$$CF_3-(CF_2)_n-(CH_2)_2-Si(R^4)_3$$

n being in the range between 7 and 11 and $R^4$ representing a small residual alkyl content.

For one particular hydrophobizing treatment, a 90% 2-propanol/10% 0.3N HCl mixture in water may be used. Added to this in an amount of 2% is $C_8F_{17}(CH_2)_2Si(OEt)_3$. In this formula, "Et" represents an ethyl.

Typical methods of applying this hydrophobizing layer are for example friction application, spraying application, vacuum evaporation application, etc.

However, the concrete examples above do not exclude the use of other hydrophobizing compositions within the context of the present invention, so long as their good adhesion to the lower layer and their compatibility with the latter are guaranteed.

Further details and advantages of the subject of the invention will emerge from the drawing of an exemplary embodiment and from its detailed description given below.

Figure 1:
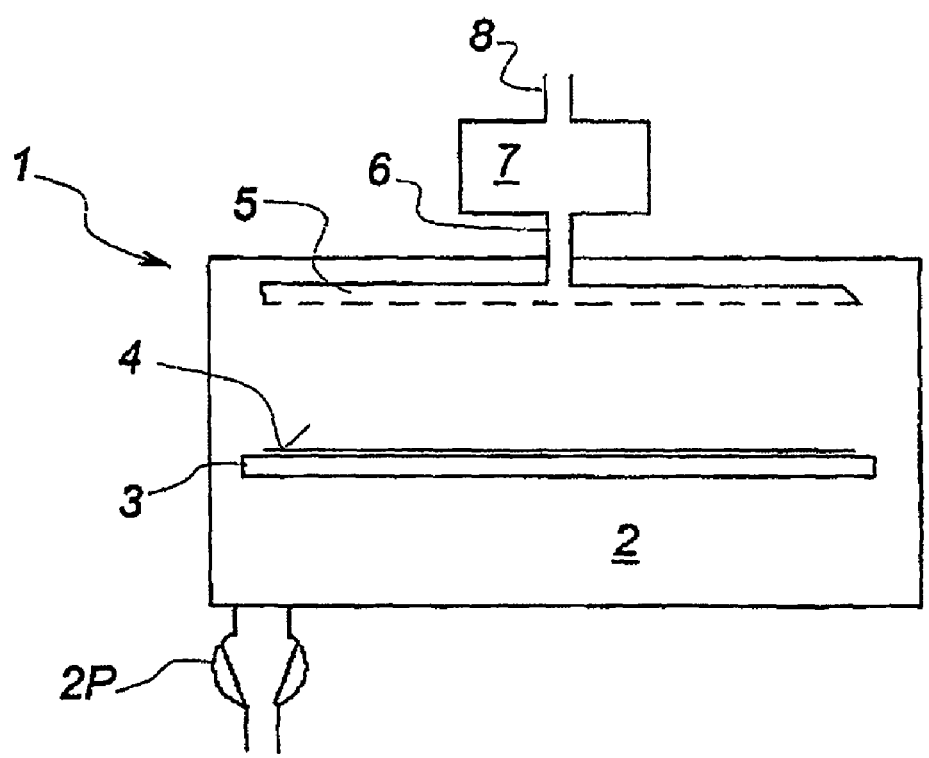
FIG. 1 shows schematically, and not to scale, one embodiment of a reactor for the plasma treatment of coated supports.

In FIG. 1, a treatment device 1 (also called a plasma reactor) comprises a vacuum chamber 2 in addition to a pumping device 2P, a receptacle 3 for a support, shown only in sketched form, on which a support 4 has been placed (or on which it may also be moved), a gas distributor 5 and a plasma chamber 7, which is connected to the latter via a duct 6, for activating a working or etching gas of the type indicated previously, which is supplied via a gas inlet 8.

During the operation, the gas is fed into the plasma chamber 7 via the inlet 8 and activated therein by an intense electromagnetic field, that is to say brought into a state of greater chemical activity and greater etching potential. Via the duct 6, it reaches the distributor 5, which distributes it in the vacuum chamber 2 so as to be spread uniformly sufficient for the entire surface of the support placed therein to be in as uniform as possible contact with the etching gas. Because the gas particles are continuously removed by the pumping device 2P out of the vacuum chamber 2, the injected gas is immediately removed with the volatile particles torn off from the coating on the support.

It should be explicitly pointed out that, in this configuration of the installation, the plasma may be spatially restricted to the "prechamber" 7, whereas the working gas passes through the latter. Only the plasma-activated working gas enters the actual treatment or vacuum chamber 2 provided for the coated support. This has the advantage that the plasma is ignited only in the plasma chamber 7 of relatively small volume and can be maintained therein, something which would necessarily require substantially more processing in the larger vacuum chamber. Thus, again, the working or etching gas retains its activated state at least long enough to be in sufficiently prolonged contact with the surface of the support or layer to be etched.

Figure 2:
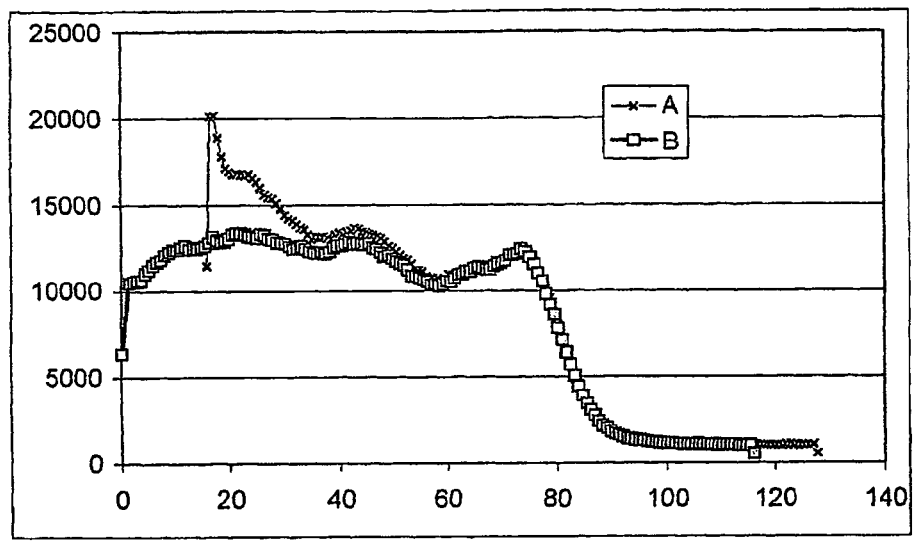
FIG. 2 shows a plot of the distribution of the amounts of aluminum and aluminum oxide (as a SIMS depth profile) in the metal oxide coating according to the invention before and after the plasma etching.
Figure 3:
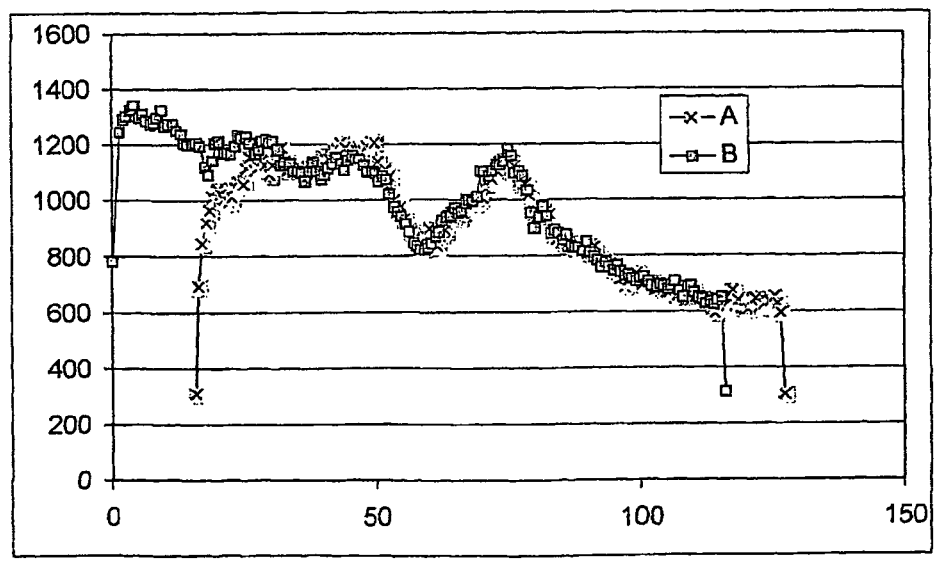
FIG. 3 shows a plot of the distribution of the amounts of silicon (silicon oxide) in the metal oxide coating according to the invention before and after the plasma etching.

FIGS. 2 and 3 show the selective action of the etching operation carried out according to the invention on the main components of the metal oxide layer, each by means of a measurement curve B (the line consisting of square symbols) before the etching and a curve A (the line of diamond symbols) after the etching. Plotted on the y axis are the intensities of the SIMS signal which allow conclusions to be drawn as regard the proportions of the particular material detected in the layer.

In both figures, the two curves are aligned one with respect to the other along the x axis (the distance along the depth of the layer, in nanometers nm) in such a way that the surface of the support or of the glass is located at the same x value (about 120 nm). Consequently, it may be seen in the two curves A that there is a reduction of a few nanometers in the total thickness of the layer. Although the curves B start at 0 nm, and therefore at the initial surface of the layer, even when it is rough, the measured values of the curves A start only at about 20 nm, because of the displacement or normalization of the two curves, as mentioned, relative to the position of the surface of the glass.

FIG. 3 clearly shows that, before the etching, the measured concentration of Si is relatively uniform over the 0 to 50 nm range, whereas after the selective etching (which acts only on silicon), the concentration is greatly reduced and resumes its previous value only at about 30 nm. Beyond this depth of penetration, the etching operation carried out as a trial no longer has any effect on the proportion of Si.

In contrast, FIG. 2 shows the large relative reduction of the proportion of Al in the layer. Whereas before the etching (curve B), the Al is distributed relatively uniformly up to a depth of about 60 to 70 nm, after the etching (curve A), a large (relative) increase in the Al signal is observed at the surface, said signal resuming its initial value only at about 30 to 40 nm. This relative enrichment with Al on the etched surface results from the selective removal of material from the silicon (or silicon oxide) matrix and furthermore leads to even greater irregularity of the surface of the layer.

After this treatment, a hydrophobizing coating of the type mentioned above is applied in a manner known per se. Very durable hydrophobicity, resisting even mechanical attack (for example by windshield wipers operating dry), can be expected of this treatment.

It may be easily proven by measurement techniques that the resistance of the coating to mechanical wear has been increased.

The invention claimed is:

1. A method of producing a coating on a support or a glass surface, comprising
    depositing a first metal oxide or metal oxynitride as a thin layer on the support or glass surface,
    subjecting the thin layer to plasma etching or plasma-activated etching to roughen the surface of the thin layer,
    applying a second coating to the roughened surface, said second coating being capable of adhering to the layer of said first metal oxide,
    wherein the first metal oxide or metal oxynitride is deposited with at least a second metal oxide or metal oxynitride, the second metal oxide or metal oxynitride being distributed within the deposited layer, and wherein the etching removes less of the second metal oxide or metal oxynitride than first metal oxide or metal oxynitride to form, after etching, on the surface, irregular raised features comprising at least a second metal oxide or metal oxynitride,
    wherein the first metal oxide or metal oxynitride layer comprises $SiO_x$, $SiO_xC_y$, $SiO_xN_y$, $SiO_yC_yN_z$, where x, y, z, $\leqq 2$; and optionally hydrogen;
    wherein the second metal oxide or metal oxynitride is formed from a dopant comprised in the first metal oxide or metal oxynitride layer, wherein the dopant is Al, Na, B, Rb, Cs, K, Li, Ba, Sr, Mg, Ca, La, Ti, Zr, an alkali metal, an alkaline-earth metal or a rare earth metal.

2. The method as claimed in claim 1, wherein the first metal oxide or metal oxynitride layer is deposited by sputtering on the support or glass surface, wherein controlled roughness of the surface being created by controlling the sputtering pressure and/or the sputtering energy.

3. The method as claimed in claim 1, wherein the first metal oxide or metal oxynitride layer is applied by chemical vapor deposition (CVD) or evaporation.

4. The method as claimed in claim 1, wherein the dopant is aluminum.

5. The method as claimed in claim 1, wherein the first metal oxide or metal oxynitride layer is selected in such a way that the first metal oxide or metal oxynitride layer withstands, without being damaged, a heat treatment that comprises a temperature necessary for bending the support or glass and wherein after said heat treatment, the first metal oxide or metal oxynitride layer has in particular a light transmittance of at least 75%.

6. The method as claimed in claim 1, further comprising heating the first metal oxide or metal oxynitride layer, after said depositing, in such a way that atoms from the substrate or glass diffuse into said first metal oxide or metal oxynitride layer.

7. The method as claimed in claim 1, further comprising depositing a diffusion barrier layer on the support or glass surface before the first metal oxide or metal oxynitride layer.

8. The method as claimed in claim 1, wherein the plasma etching or plasma-activated etching comprises a gas comprising fluorine that is plasma-activated to form fluorine compounds.

9. The method as claimed in claim 8, wherein the plasma etching or plasma-activated etching comprises $SF_6$, $CF_4$, $C_2F_6$, or $CHF_3$ and $O_2$.

10. The method as claimed in claim 1, wherein the support or glass surface is treated in a chamber with a plasma-activated etching gas outside the chamber.

11. The method as claimed in claim 10, wherein the plasma-activated etching gas is introduced onto the support or glass surface by a distributor.

12. The method as claimed in claim 10, wherein the support or glass surface is kept stationary during the etching.

13. The method as claimed in claim 10, wherein the support or glass surface passes through a vacuum chamber during the etching.

14. The method as claimed in claim 1, wherein the applying the second coating to the roughened surface comprises applying $CF_3$—$(CF_2)_n$—$(CH_2)_2$—$Si(R^4)_3$, wherein n is 7 to 11 and $R^4$ represents a residual alkyl content.

15. The method as claimed in claim 1, which is to produce a coating on a glass surface.

\* \* \* \* \*